(12) United States Patent
Komin et al.

(10) Patent No.: US 8,318,589 B2
(45) Date of Patent: Nov. 27, 2012

(54) METHOD FOR FORMING TRANSPARENT CONDUCTIVE OXIDE

(75) Inventors: Valery V. Komin, Palo Alto, CA (US);
Hien-Minh Huu Le, San Jose, CA (US);
David Tanner, San Jose, CA (US);
James S. Papanu, San Rafael, CA (US);
Philip A. Greene, Oakland, CA (US);
Suresh M. Shrauti, Dallas, TX (US);
Roman Gouk, San Jose, CA (US);
Steven Verhaverbeke, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 277 days.

(21) Appl. No.: 12/748,780

(22) Filed: Mar. 29, 2010

(65) Prior Publication Data
US 2010/0311228 A1 Dec. 9, 2010

Related U.S. Application Data

(60) Provisional application No. 61/185,171, filed on Jun. 8, 2009, provisional application No. 61/186,633, filed on Jun. 12, 2009.

(51) Int. Cl.
*H01L 21/20* (2006.01)
(52) U.S. Cl. ............ 438/478; 438/96; 438/97; 438/609; 257/136; 257/255; 257/E21.002; 257/E31.111
(58) Field of Classification Search .............. 438/96–98, 438/478, 609; 257/E21.159, E21.002, E31.111, 257/E31.126; 136/255
See application file for complete search history.

(56) References Cited

U.S. PATENT DOCUMENTS

| | | | |
|---|---|---|---|
| 4,732,621 A | 3/1988 | Murata et al. | |
| 6,238,808 B1 | 5/2001 | Arao et al. | |
| 6,268,233 B1 * | 7/2001 | Sano | ............................... 438/57 |
| 2007/0167025 A1 | 7/2007 | Park et al. | |

(Continued)

FOREIGN PATENT DOCUMENTS

JP 11-189436 A 7/1999

(Continued)

OTHER PUBLICATIONS

International Search Report and Written Opinion for PCT/US2010/037960 dated Dec. 28, 2010.

(Continued)

*Primary Examiner* — Evan Pert
*Assistant Examiner* — Mark A Laurenzi
(74) *Attorney, Agent, or Firm* — Patterson & Sheridan, LLP

(57) ABSTRACT

Embodiments disclosed herein generally relate to a process of depositing a transparent conductive oxide layer over a substrate. The transparent oxide layer is sometimes deposited onto a substrate for later use in a solar cell device. The transparent conductive oxide layer may be deposited by a "cold" sputtering process. In other words, during the sputtering process, a plasma is ignited in the processing chamber which naturally heats the substrate. No additional heat is provided to the substrate during deposition such as from the susceptor. After the transparent conductive oxide layer is deposited, the substrate may be annealed and etched, in either order, to texture the transparent conductive oxide layer. In order to tailor the shape of the texturing, different wet etch chemistries may be utilized. The different etch chemistries may be used to shape the surface of the transparent conductive oxide and the etch rate.

20 Claims, 4 Drawing Sheets

U.S. PATENT DOCUMENTS

2008/0130082 A1* 6/2008 Kothari et al. ............... 359/238
2010/0132783 A1 6/2010 Le et al.
2010/0133094 A1 6/2010 Le et al.

FOREIGN PATENT DOCUMENTS

| JP | 2002-025350 A | 1/2002 |
| KR | 10-2007-0117366 | 12/2007 |
| KR | 10-2008-0005002 | 1/2008 |
| KR | 10-2009-0042831 | 4/2009 |

OTHER PUBLICATIONS

International Search Report and Written Opinion for PCT/US2010/037612 dated Jan. 10, 2011.

* cited by examiner

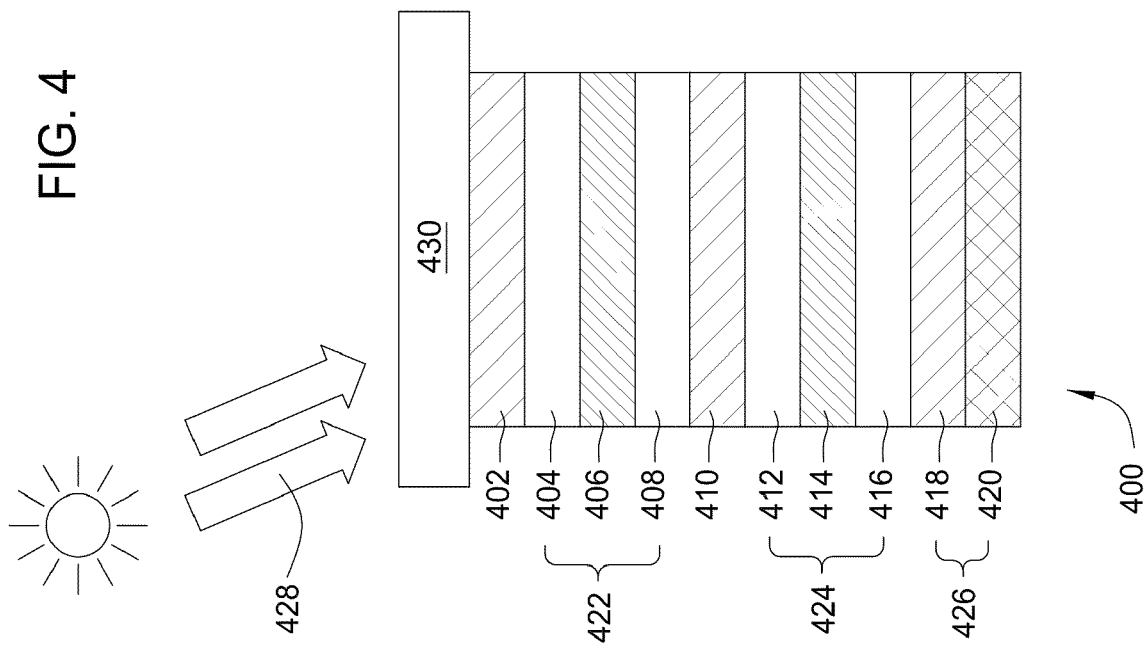

METHOD FOR FORMING TRANSPARENT CONDUCTIVE OXIDE

CROSS-REFERENCE TO RELATED APPLICATIONS

This application claims benefit of U.S. Provisional Patent Application Ser. No. 61/185,171 (APPM/14441L), filed Jun. 8, 2009 and U.S. Provisional Patent Application Ser. No. 61/186,633 (APPM/14441L02), filed Jun. 12, 2009, each of which are herein incorporated by reference.

BACKGROUND OF THE INVENTION

1. Field of the Invention

Embodiments disclosed herein generally relate to a process of depositing a transparent conductive oxide layer over a substrate.

2. Description of the Related Art

Photovoltaic (PV) devices or solar cells are devices which convert sunlight into direct current (DC) electrical power. PV or solar cells typically have one or more p-n junctions. Each junction comprises two different regions within a semiconductor material where one side is denoted as the p-type region and the other as the n-type region. When the p-n junction of the PV cell is exposed to sunlight (consisting of energy from photons), the sunlight is directly converted to electricity through the PV effect. PV solar cells generate a specific amount of electric power and cells are tiled into modules sized to deliver the desired amount of system power. PV modules are created by connecting a number of PV solar cells and are then joined into panels with frames and connectors.

Several types of silicon films, including microcrystalline silicon ($\mu c$-Si), amorphous silicon (a-Si), polycrystalline silicon (poly-Si) and the like, may be utilized to form PV devices. A transparent conductive film, sometimes referred to as a transparent conductive oxide (TCO) may be used as a top surface electrode disposed on the top of the PV solar cells. Furthermore, the TCO layer may be disposed between a substrate and a photoelectric conversion unit as a contact layer. The TCO should have high optical transmittance in the visible or higher wavelength region to facilitate transmitting sunlight into the solar cells without adversely absorbing or reflecting light energy. Additionally, low contact resistance and high electrical conductivity of the TCO are desired to provide high photoelectric conversion efficiency and electricity collection. A certain degree of texture or surface roughness of the TCO is also desired to assist sunlight trapping in the films by promoting light scattering. Overly high impurities or contaminant of the TCO often result in high contact resistance at the interface of the TCO and adjacent films, thereby reducing carrier mobility within the PV cells. Furthermore, insufficient transparency of the TCO may adversely reflect light back to the environment, resulting in a diminished amount of sunlight entering the PV cells and a reduction in the photoelectric conversion efficiency.

Therefore, there is a need for an improved method for fabricating a TCO.

SUMMARY OF THE INVENTION

Embodiments disclosed herein generally relate to a process of depositing a transparent conductive oxide layer over a substrate. The transparent oxide layer is sometimes deposited onto a substrate for later use in a solar cell device. The transparent conductive oxide layer may be deposited by a "cold" sputtering process. In other words, during the sputtering process, a plasma is ignited in the processing chamber which naturally heats the substrate. No additional heat is provided to the substrate during deposition such as from the susceptor. After the transparent conductive oxide layer is deposited, the substrate may be annealed and etched, in either order, to texture the transparent conductive oxide layer. In order to tailor the shape of the texturing, different wet etch chemistries may be utilized. The different etch chemistries may be used to shape the surface of the transparent conductive oxide and the etch rate.

In one embodiment, a method is disclosed. The method includes forming a transparent conductive oxide layer over a substrate and annealing the formed transparent conductive oxide layer. The method additionally includes etching the annealed transparent conductive oxide layer to form a roughened surface. The etching includes exposing the annealed transparent conductive oxide layer to a wet etchant composition selected from the group consisting of: HCl, $H_2O_2$ and de-ionized water having a concentration ratio of HCl and $H_2O_2$ relative to the de-ionized water of about 0.25 percent to about 10 percent; HCl and de-ionized water having a concentration ratio of HCl relative to the de-ionized water of about 0.25 percent to about 10 percent; $HNO_3$ and de-ionized water having a concentration ratio of $HNO_3$ relative to the de-ionized water of about 0.25 percent to about 10 percent; or $H_2SO_4$ and de-ionized water having a concentration ratio of $H_2SO_4$ relative to the de-ionized water of about 0.25 percent to about 10 percent.

In another embodiment, a method is disclosed. The method includes sputter depositing a transparent conductive oxide layer over a substrate and annealing the sputter deposited transparent conductive oxide layer at a first temperature. The method also includes thermal quenching the annealed transparent conductive oxide layer at a second temperature lower than the first temperature in a substantially oxygen free environment. The method additionally includes etching the thermally quenched transparent conductive oxide layer to form a roughened surface. The etching comprises exposing the thermally quenched transparent conductive oxide layer to a wet etchant composition selected from the group consisting of: a mixture of HCl, $H_2O_2$ and de-ionized water having a concentration ratio of HCl and $H_2O_2$ relative to the de-ionized water of about 0.25 percent to about 10 percent; and a mixture of HCl and de-ionized water having a concentration ratio of HCl relative to the de-ionized water of about 0.25 percent to about 10 percent. The method also includes quenching the etched transparent conductive oxide layer by exposing the transparent conductive oxide layer to a basic solution having a pH of greater than about 10 and rinsing the quenched transparent conductive oxide layer with de-ionized water.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3 depicts an exemplary cross sectional view of a crystalline silicon-based thin film PV solar cell in accordance with one embodiment of the present invention.

FIG. 4 depicts an exemplary cross sectional view of a tandem junction PV solar cell in accordance with one embodiment of the present invention.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments disclosed herein generally relate to a process of depositing a transparent conductive oxide layer over a substrate. The transparent oxide layer is sometimes deposited onto a substrate for later use in a solar cell device. The transparent conductive oxide layer may be deposited by a "cold" sputtering process. In other words, during the sputtering process, a plasma is ignited in the processing chamber which naturally heats the substrate. No additional heat is provided to the substrate during deposition such as from the susceptor. After the transparent conductive oxide layer is deposited, the substrate may be annealed and etched, in either order, to texture the transparent conductive oxide layer. In order to tailor the shape of the texturing, different wet etch chemistries may be utilized. The different etch chemistries may be used to shape the surface of the transparent conductive oxide and the etch rate.

Figure 1:
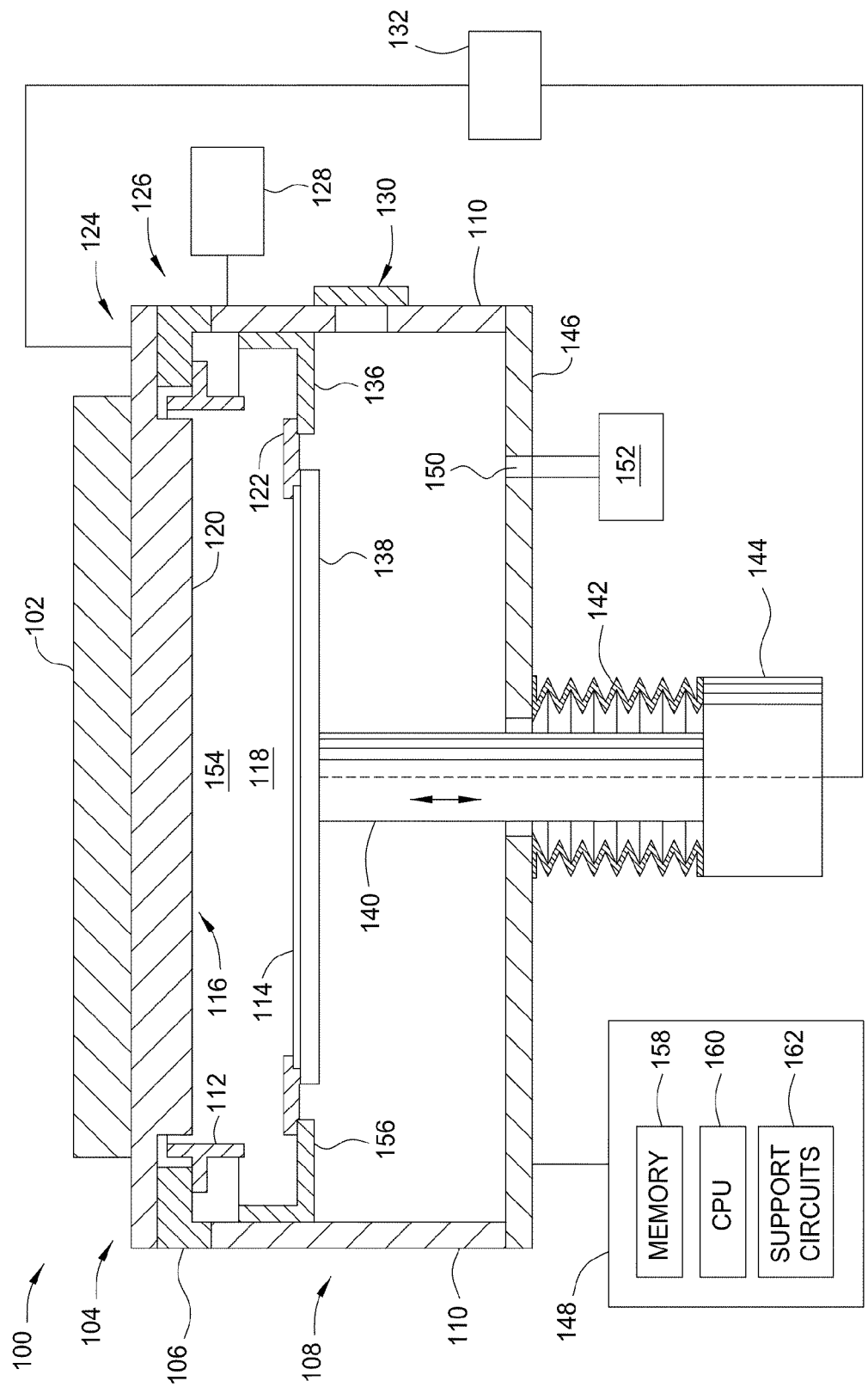
FIG. 1 depicts a schematic cross-sectional view of one embodiment of a process chamber in accordance with the invention.

FIG. 1 illustrates an exemplary reactive sputter process chamber 100 suitable for sputter depositing materials according to one embodiment of the invention. One example of the process chamber that may be adapted to benefit from the invention is a PVD process chamber, available from Applied Materials, Inc., located in Santa Clara, Calif. It is contemplated that other sputter process chambers, including those from other manufactures, may be adapted to practice the present invention.

The process chamber 100 includes a chamber body 108 having a processing volume 118 defined therein. The chamber body 108 has sidewalls 110 and a bottom 146. The dimensions of the chamber body 108 and related components of the process chamber 100 are not limited and generally are proportionally larger than the size of the substrate 114 to be processed. Any substrate size may be processed in a suitably configured chamber. Examples of suitable substrate sizes include substrates having a surface area of about 2,000 centimeter square or more, such as about 4,000 centimeter square or more, for example about 10,000 centimeter square or more. In one embodiment, a substrate having a surface area of about 50,000 centimeter square or more may be processed.

A chamber lid assembly 104 is mounted on the top of the chamber body 108. The chamber body 108 may be fabricated from aluminum or other suitable materials. A substrate access port 130 is formed through the sidewall 110 of the chamber body 108, facilitating the transfer of a substrate 114 (i.e., a solar panel, a flat panel display substrate, a semiconductor wafer, or other workpiece) into and out of the process chamber 100. The access port 130 may be coupled to a transfer chamber and/or other chambers of a substrate processing system.

A gas source 128 is coupled to the chamber body 108 to supply process gases into the processing volume 118. In one embodiment, process gases may include inert gases, non-reactive gases, and reactive gases. Examples of process gases that may be provided by the gas source 128 include, but not limited to, argon gas (Ar), helium (He), nitrogen gas ($N_2$), oxygen gas ($O_2$), $H_2$, $NO_2$, $N_2O$ and $H_2O$ among others.

A pumping port 150 is formed through the bottom 146 of the chamber body 108. A pumping device 152 is coupled to the process volume 118 to evacuate and control the pressure therein. In one embodiment, the pressure level of the process chamber 100 may be maintained at about 1 Torr or less. In another embodiment, the pressure level of the process chamber 100 may be maintained at about $10^{-3}$ Torr or less. In yet another embodiment, the pressure level of the process chamber 100 may be maintained at about $10^{-5}$ Torr to about $10^{-7}$ Torr. In another embodiment, the pressure level of the process chamber 100 may be maintained at about $10^{-7}$ Torr or less.

The lid assembly 104 generally includes a target 120 and a ground shield assembly 126 coupled thereto. The target 120 provides a material source that can be sputtered and deposited onto the surface of the substrate 114 during a PVD process. The target 120 or target plate may be fabricated from a material utilized for deposition species. A high voltage power supply, such as a power source 132, is connected to the target 120 to facilitate sputtering materials from the target 120. In one embodiment, the target 120 may be fabricated from a material containing zinc (Zn) metal. In another embodiment, the target 120 may be fabricated from materials including a metallic zinc (Zn) containing target, zinc alloy, zinc and aluminum alloy and the like. In yet another embodiment, the target 120 may be fabricated from materials including a zinc containing material and an aluminum containing material. In one embodiment, the target may be fabricated from a zinc oxide and aluminum oxide material.

In one embodiment, the target 120 is fabricated from a zinc and aluminum alloy having a desired ratio of zinc element to aluminum element fabricated in the target 120. The aluminum formed in the target 120 assists in maintaining the target conductivity at a certain range so as to efficiently enable a uniform sputter process across the target surface. The aluminum elements in the target 120 are also believed to increase film transmittance when sputtered off and deposited onto the substrate. In one embodiment, the concentration of the aluminum element formed in the zinc target 120 is controlled at less than about 5 percent by weight. In the embodiment wherein the target 120 is fabricated from ZnO and $Al_2O_3$ alloy, the $Al_2O_3$ dopant concentration in the ZnO target is controlled at less than about 3 percent by weight, for example about less than 2 percent by weight, such as about less than 0.5 percent by weight, for example, about 0.25 percent by weight.

The target 120 generally includes a peripheral portion 124 and a central portion 116. The peripheral portion 124 is disposed over the sidewalls 110 of the chamber 100. The central portion 116 of the target 120 may have a curvature surface slightly extending towards the surface of the substrate 114 disposed on a substrate support 138. The spacing between the target 120 and the substrate support 138 is maintained between about 50 mm and about 150 mm during processing. It is noted that the dimension, shape, materials, configuration and diameter of the target 120 may be varied for specific process or substrate requirements. In one embodiment, the target 120 may further include a backing plate having a central portion bonded and/or fabricated from a material desired to be sputtered onto the substrate surface. The target 120 may also include adjacent tiles or material segments that together form the target.

Optionally, the lid assembly 104 may further comprise a magnetron assembly 102 mounted above the target 120 which enhances efficient sputtering materials from the target 120 during processing. Examples of the magnetron assembly 102 include a linear magnetron, a serpentine magnetron, a spiral magnetron, a double-digitated magnetron, a rectangularized spiral magnetron, among others. Additionally, the target 120 may be a cylindrical, rotatable sputtering target assembly in which the magnet assembly is within the inner core of the target assembly.

The ground shield assembly 126 of the lid assembly 104 includes a ground frame 106 and a ground shield 112. The ground shield assembly 126 may also include another chamber shield member, a target shield member, a dark space shield, and a dark space shield frame. The ground shield 112 is coupled to the peripheral portion 124 by the ground frame 106 defining an upper processing region 154 below the central portion of the target 120 in the process volume 118. The ground frame 106 electrically insulates the ground shield 112 from the target 120 while providing a ground path to the chamber body 108 of the process chamber 100 through the sidewalls 110. The ground shield 112 constrains plasma generated during processing within the upper processing region 154 and dislodges target source material from the confined central portion 116 of the target 120, thereby allowing the dislodged target source to be mainly deposited on the substrate surface rather than chamber sidewalls 110. In one embodiment, the ground shield 112 may be formed by one or more work-piece fragments and/or a number of these pieces bonding by a substrate process, such as welding, gluing, high pressure compression, etc.

A shaft 140 extending through the bottom 146 of the chamber body 108 couples to a lift mechanism 144. The lift mechanism 144 is configured to move the substrate support 138 between a lower transfer position and an upper processing position. A bellows 142 circumscribes the shaft 140 and couples to the substrate support 138 to provide a flexible seal therebetween, thereby maintaining vacuum integrity of the chamber processing volume 118.

A shadow frame 122 is disposed on the periphery region of the substrate support 138 and is configured to confine deposition of source material sputtered from the target 120 to a desired portion of the substrate surface. A chamber shield 136 may be disposed on the inner wall of the chamber body 108 and have a lip 156 extending inward to the processing volume 118 configured to support the shadow frame 122 disposed around the substrate support 138. As the substrate support 138 is raised to the upper position for processing, an outer edge of the substrate 114 disposed on the substrate support 138 is engaged by the shadow frame 122 and the shadow frame 122 is lifted up and spaced away from the chamber shield 136. When the substrate support 138 is lowered to the transfer position adjacent to the substrate transfer port 130, the shadow frame 122 is set back on the chamber shield 136. Lift pins (not shown) are selectively moved through the substrate support 138 to list the substrate 114 above the substrate support 138 to facilitate access to the substrate 114 by a transfer robot or other suitable transfer mechanism.

A controller 148 is coupled to the process chamber 100. The controller 148 includes a central processing unit (CPU) 160, a memory 158, and support circuits 162. The controller 148 is utilized to control the process sequence, regulating the gas flows from the gas source 128 into the chamber 100 and controlling ion bombardment of the target 120. The CPU 160 may be of any form of a general purpose computer processor that can be used in an industrial setting. The software routines can be stored in the memory 158, such as random access memory, read only memory, floppy or hard disk drive, or other form of digital storage. The support circuits 162 are conventionally coupled to the CPU 160 and may comprise cache, clock circuits, input/output subsystems, power supplies, and the like. The software routines, when executed by the CPU 160, transform the CPU into a specific purpose computer (controller) 148 that controls the process chamber 100 such that the processes are performed in accordance with the present invention. The software routines may also be stored and/or executed by a second controller (not shown) that is located remotely from the chamber 100.

During processing, the material is sputtered from the target 120 and deposited on the surface of the substrate 114. The target 120 and the substrate support 138 are biased relative to each other by the power source 132 to maintain a plasma formed from the process gases supplied by the gas source 128. The ions from the plasma are accelerated toward and strike the target 120, causing target material to be dislodged from the target 120. The dislodged target material and process gases forms a layer on the substrate 114 with desired compositions. In some in-line embodiments, the sputtering target 120 may be biased relative to a floating anode such as the substrate 114, the chamber wall, another target or even another electrode.

Figure 2:
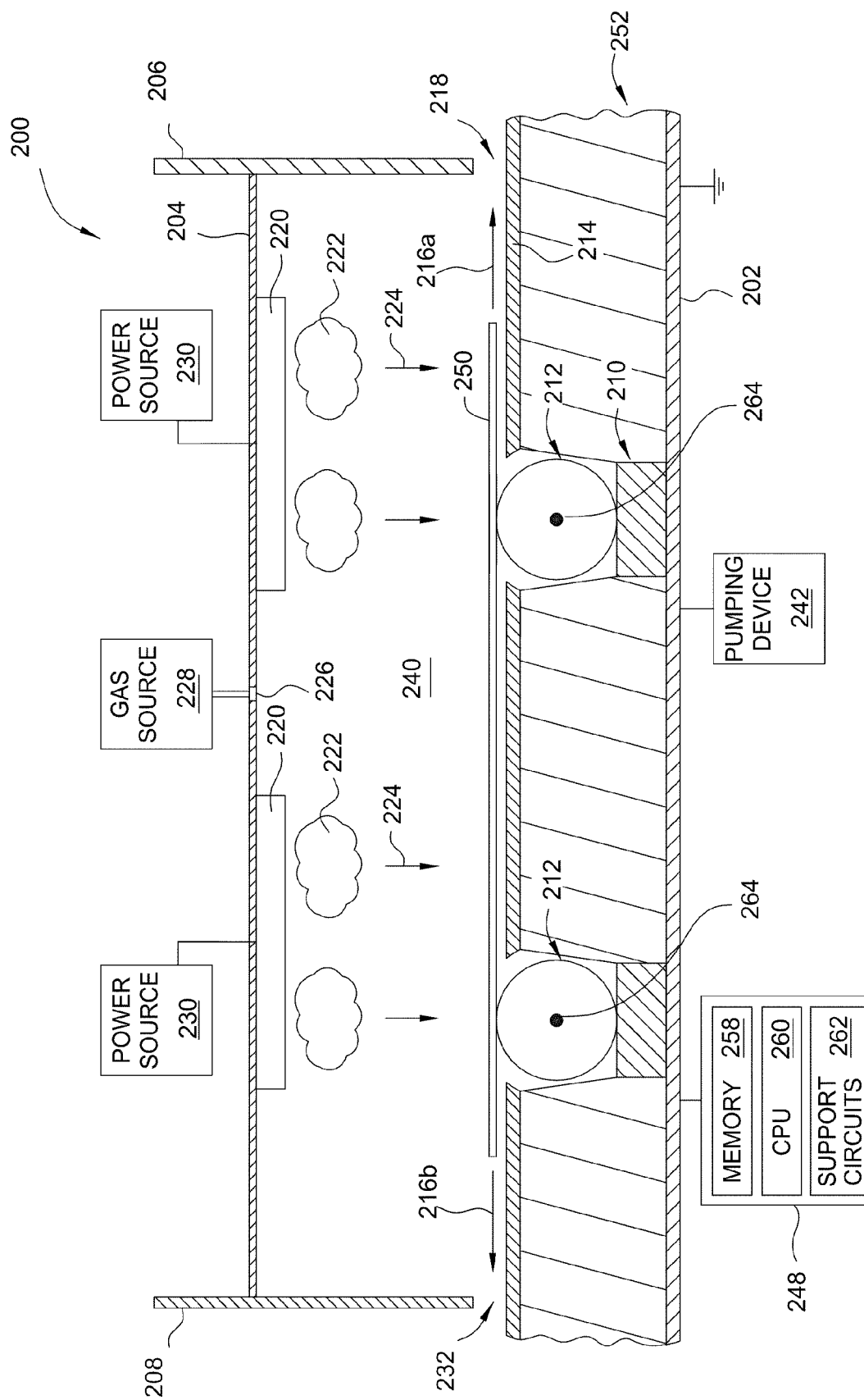
FIG. 2 depicts a schematic cross-sectional view of another embodiment of a process chamber in accordance with the invention.

FIG. 2 illustrates another exemplary reactive sputter process chamber 200 suitable for sputter depositing materials according to one embodiment of the invention. One example of a process chamber that may be adapted to benefit from the invention is a PVD process chamber, available from Applied Materials, Inc., located in Santa Clara, Calif. It is contemplated that other sputter process chambers, including those from other manufactures, may be adapted to practice the present invention.

The processing chamber 200 includes a top wall 204, a bottom wall 202, a front wall 206 and a back wall 208, enclosing an interior processing region 240 within the process chamber 200. At least one of the walls 202, 204, 206, 208 is electrically grounded. The front wall 206 includes a front substrate transfer port 218 and the back wall 208 includes a back substrate transfer port 232 that facilitate substrate entry and exit from the processing chamber 200. The front transfer port 218 and the back transfer port 232 may be slit valves or other suitable sealable doors that can maintain vacuum within the processing chamber 200. The transfer ports 218, 232 may be coupled to a transfer chamber, load lock chamber and/or other chambers of a substrate processing system.

One or more PVD targets 220 may be mounted to the top wall 204 to provide a material source that can be sputtered from the target 220 and deposited onto the surface of the substrate 250 during a PVD process. The target 220 may be fabricated from a material utilized for deposition species. A high voltage power supply, such as a power source 230, is connected to the target 220 to facilitate sputtering materials from the target 220. In one embodiment, the target 220 may be fabricated from a material containing zinc (Zn) metal. In another embodiment, the target 220 may be fabricated from materials including metallic zinc (Zn), zinc alloy, zinc oxide and the like. Different dopant materials, such as boron containing materials, titanium containing materials, tantalum containing materials, tungsten containing materials, aluminum containing materials, gallium containing materials, indium containing materials, and the like, may be doped into a zinc containing base material to form a target with a desired dopant concentration. In one embodiment, the dopant materials may include one or more of boron containing materials, titanium containing materials, tantalum containing materials, aluminum containing materials, tungsten containing materials, gallium containing materials, indium containing materials, alloys thereof, combinations thereof and the like. In one embodiment, the target 220 may be fabricated from a zinc oxide material having dopants, such as, titanium oxide, tantalum oxide, tungsten oxide, aluminum oxide, aluminum metal, boron oxide, gallium, indium, and the like, doped therein. In one embodiment, the dopant concentration in the zinc containing material comprising the target 220 is controlled to less than about 10 percent by weight.

In one embodiment, the target 220 is fabricated from a zinc and aluminum alloy having a desired ratio of zinc element to aluminum element. The aluminum elements comprising the target 220 assists in maintaining the target conductivity within a desired range so as to efficiently enable a uniform sputter process across the target surface. The aluminum elements in the target 220 are also believed to increase film transmittance when sputtered off and deposited onto the substrate 250. In one embodiment, the concentration of the aluminum element comprising the zinc target 220 is controlled to less than about 5 percent by weight. In embodiments wherein the target 220 is fabricated from ZnO and $Al_2O_3$ alloy, the $Al_2O_3$ dopant concentration in the ZnO base target material is controlled to less than about 2 percent by weight, such as less than 0.5 percent by weight, for example, about 0.25 percent by weight.

Optionally, a magnetron assembly (not shown) may be optionally mounted above the target 220 which enhances efficient sputtering materials from the target 220 during processing. Examples of the magnetron assembly include a linear magnetron, a serpentine magnetron, a spiral magnetron, a double-digitated magnetron, a rectangularized spiral magnetron, among others.

A gas source 228 supplies process gases into the processing volume 240 through a gas supply inlet 226 formed through the top wall 204 and/or other wall of the chamber 200. In one embodiment, process gases may include inert gases, non-reactive gases, and reactive gases. Examples of process gases that may be provided by the gas source 228 include, but are not limited to, argon gas (Ar), helium (He), nitrogen gas ($N_2$), oxygen gas ($O_2$), $H_2$, $NO_2$, $N_2O$ and $H_2O$ among others. It is noted that the location, number and distribution of the gas source 228 and the gas supply inlet 226 may be varied and selected according to different designs and configurations of the specific processing chamber 200.

A pumping device 242 is coupled to the process volume 240 to evacuate and control the pressure therein. In one embodiment, the pressure level of the interior processing region 240 of the process chamber 200 may be maintained at about 1 Torr or less. In another embodiment, the pressure level within the process chamber 100 may be maintained at about $10^{-3}$ Torr or less. In yet another embodiment, the pressure level within the process chamber 200 may be maintained at about $10^{-5}$ Torr to about $10^{-7}$ Torr. In another embodiment, the pressure level of the process chamber 100 may be maintained at about $10^{-7}$ Torr or less.

A substrate carrier system 252 is disposed in the interior processing region 240 to carry and convey a plurality of substrates 250 disposed in the processing chamber 200. In one embodiment, the substrate carrier system 252 is disposed on the bottom wall 202 of the chamber 200. The substrate carrier system 252 includes a plurality of cover panels 214 disposed among a plurality of rollers 212. The rollers 212 may be positioned in a spaced-apart relationship. The rollers 212 may be actuated by actuating device (not shown) to rotate the rollers 212 about an axis 264 fixedly disposed in the processing chamber 200. The rollers 212 may be rotated clockwise or counter-clockwise to advance (a forward direction shown by arrow 216a) or backward (a backward direction shown by arrow 216b) the substrates 250 disposed thereon. As the rollers 212 rotate, the substrate 250 is advanced over the cover panels 214. In one embodiment, the rollers 212 may be fabricated from a metallic material, such as Al, Cu, stainless steel, or metallic alloys, among others.

A top portion of the rollers 212 is exposed to the processing region 240 between the cover panels 214, thus defining a substrate support plane that supports the substrate 250 above the cover panels 214. During processing, the substrates 250 enter the processing chamber 200 through the back access port 232. One or more of the rollers 212 are actuated to rotate, thereby advancing the substrate 250 across the rollers 212 in the forward direction 216a through the processing region 240 for deposition. As the substrate 250 advances, the material sputtered from the target 220 falls down and deposits on the substrate 250 to form a TCO layer with desired film properties. As the substrate 250 continues to advance, the materials sputtered from different targets 220 are consecutively deposited on the substrate surface, thereby forming a desired layer of TCO film on the substrate surface.

In order to deposit the TCO layer on the substrate 250 with high quality, an insulating member 210 electrically isolates the rollers 212 from ground. The insulating member 210 supports the rollers 212 while interrupting the electrical path between the rollers 212 and a grounded surface, such as the processing chamber 200. As the rollers 212 are insulated from ground, the substrate 250 supported thereon is maintained in an electrically floating position, thereby assisting accumulating ions, charges, and species from the plasma on the substrate surface. The accumulation of the ions and plasma on the substrate surface helps retain reactive species on the substrate surface and allows the active species to have sufficient time to pack atoms on the substrate surface, thereby improving the quality of the deposited TCO layer, such as providing high film density. Accordingly, unwanted defects, such as voids or irregular atoms/grain arrangement may be reduced and/or eliminated, thereby providing a TCO layer having desirable high film density and low film resistivity.

In one embodiment, the insulating mechanism 210 may be in the form of an insulating pad fabricated from an insulating material, such as rubber, glass, polymer, plastic, and polyphenylene sulfide (PPS), polyetheretherketone (PEEK) or any other suitable insulating materials that can provide insulation to the rollers to the bottom wall 202 of the processing chamber 200. In one embodiment, the insulating pad 210 is a non-conductive material, such as polyphenylene sulfide (PPS), polyetheretherketone (PEEK), or the like.

A controller 248 is coupled to the process chamber 200. The controller 248 includes a central processing unit (CPU) 260, a memory 258, and support circuits 262. The controller 248 is utilized to control the process sequence, regulating the gas flows from the gas source 228 into the chamber 200 and controlling ion bombardment of the target 220. The CPU 260 may be of any form of a general purpose computer processor that can be used in an industrial setting. The software routines can be stored in the memory 258, such as random access memory, read only memory, floppy or hard disk drive, or other form of digital storage. The support circuits 262 are conventionally coupled to the CPU 260 and may comprise cache, clock circuits, input/output subsystems, power supplies, and the like. The software routines, when executed by the CPU 260, transform the CPU 260 into a specific purpose computer (controller) 248 that controls the process chamber 200 such that the processes are performed in accordance with the present invention. The software routines may also be stored and/or executed by a second controller (not shown) that is located remotely from the chamber 200.

During processing, as the substrate 250 is advanced by the roller 212, the material is sputtered from the target 220 and deposited on the surface of the substrate 250. The target 220 is biased by the power source 230 to maintain a plasma 222 formed from the process gases supplied by the gas source 228 and biased toward the substrate surface (as shown by arrows 224). The ions from the plasma are accelerated toward and strike the target 220, causing target material to be dislodged from the target 220. The dislodged target material and process gases form a layer on the substrate 214 with a desired composition.

FIG. 3 depicts an exemplary cross sectional view of an amorphous silicon-based thin film PV solar cell 300 in accordance with one embodiment of the present invention. The amorphous silicon-based thin film PV solar cell 300 includes a substrate 318. The substrate 318 may be thin sheet of metal, plastic, organic material, silicon, glass, quartz, or polymer, or other suitable material. In one embodiment, the substrate 318 is a transparent substrate. The substrate 318 may have a surface area greater than about 1 square meters, such as greater than about 2 square meters. Alternatively, the thin film PV solar cell 300 may also be fabricated as polycrystalline, microcrystalline or other type of silicon-based thin films as needed. It is to be understood that the substrate 318 may be referred to as a 'superstrate' in which the solar cell is fabricated from the top down. During fabrication, the substrate 318 is typically refereed to as a substrate, but then referred to as a 'superstrate' once the final product is flipped over to face the substrate 318 towards the sun. When the final configuration of the solar cell 300 has the substrate facing the sun, the substrate 318 may comprise a transparent material. When the solar cell 300 is fabricated such that the substrate is opposite the sun, then other materials may be utilized as discussed above.

A photoelectric conversion unit 314 is formed on a transparent conductive layer, such as a TCO layer 302, disposed on the substrate 318. The photoelectric conversion unit 314 includes a p-type semiconductor layer 304, a n-type semiconductor layer 308, and an intrinsic type (i-type) semiconductor layer 306 sandwiched therebetween as a photoelectric conversion layer. An optional dielectric layer (not shown) may be disposed between the substrate 314 and the TCO layer 302 as needed. In one embodiment, the optional dielectric layer may be a silicon layer including amorphous or polysilicon, SiON, SiN, SiC, SiOC, silicon oxide ($SiO_2$) layer, doped silicon layer, or any suitable silicon containing layer. In another embodiment, the optional dielectric layer may be a titanium based layer such as titanium oxide to act as a barrier to impurities that may be present in the substrate 318.

The p-type and n-type semiconductor layers 304, 308 may be silicon based materials doped by an element selected either from group III or V. A group III element doped silicon film is referred to as a p-type silicon film, while a group V element doped silicon film is referred to as a n-type silicon film. In one embodiment, the n-type semiconductor layer 308 may be a phosphorus doped silicon film and the p-type semiconductor layer 304 may be a boron doped silicon film. The doped silicon films 304, 308 include an amorphous silicon film (a-Si), a polycrystalline film (poly-Si), and a microcrystalline film (μc-Si) with a total thickness between around 5 nm and about 50 nm. Alternatively, the doped element in semiconductor layers 304, 308 may be selected to meet device requirements of the PV solar cell 300. The n-type and p-type semiconductor layers 304, 308 may be deposited by a CVD process or other suitable deposition process.

The i-type semiconductor layer 306 is a non-doped type silicon based film. The i-type semiconductor layer 306 may be deposited under process condition controlled to provide film properties having improved photoelectric conversion efficiency. In one embodiment, the i-type semiconductor layer 306 may be fabricated from i-type polycrystalline silicon (poly-Si), i-type microcrystalline silicon film (μc-Si), amorphous silicon (a-Si), or hydrogenated amorphous silicon (a-Si:H).

After the photoelectric conversion unit 314 is formed on the TCO layer 302, a back reflector 316 is formed on the photoelectric conversion unit 314. In one embodiment, the back reflector 316 may be formed by a stacked film that includes a TCO layer 310, and a conductive layer 312. The conductive layer 312 may be at least one of Ti, Cr, Al, Ag, Au, Cu, Pt, or their alloys. The TCO layer 310 may be fabricated from a material similar to the TCO layer 302 formed on the substrate 318. The TCO layers 302, 310 may be fabricated from a selected group consisting of tin oxide ($SnO_2$), indium tin oxide (ITO), zinc oxide (ZnO), or combinations thereof. In one exemplary embodiment, the TCO layers 302, 310 may be fabricated from a ZnO layer having a desired $Al_2O_3$ dopant concentration formed in the ZnO layer.

In embodiments depicted in FIG. 3, at least one of the TCO layers 302, 310 is fabricated by a sputter deposition process of the present invention. The sputter deposition process of TCO layers 302, 310 may be performed in the processing chamber 100, as described in FIG. 1 or the process chamber 200, as described in FIG. 2.

FIG. 4 depicts an exemplary cross sectional view of a tandem type PV solar cell 400 fabricated in accordance with another embodiment of the present invention. Tandem type PV solar cell 400 has a similar structure of the PV solar cell 300 including a bottom TCO layer 402 formed on the substrate 430 and a first photoelectric conversion unit 422 formed on the TCO layer 402. The first photoelectric conversion unit 422 may be μc-Si based, poly-silicon or amorphous based photoelectric conversion unit as described with reference to the photoelectric conversion unit 314 of FIG. 3. An intermediate layer 410 may be formed between the first photoelectric conversion unit 422 and a second photoelectric conversion unit 424. The intermediate layer 410 may be a TCO layer sputter deposited. The combination of the first underlying conversion unit 422 and the second photoelectric conversion unit 424 as depicted in FIG. 4 increases the overall photoelectric conversion efficiency.

The second photoelectric conversion unit 424 may be μc-Si based, polysilicon or amorphous based, and have an μc-Si film as the i-type semiconductor layer 414 sandwiched between a p-type semiconductor layer 412 and a n-type semiconductor layer 416. A back reflector 426 is disposed on the second photoelectric conversion unit 424. The back reflector 426 may be similar to back reflector 316 as described with reference to FIG. 3. The back reflector 426 may comprise a conductive layer 420 formed on a top TCO layer 418. The materials of the conductive layer 420 and the TCO layer 418 may be similar to the conductive layer 312 and TCO layer 310 as described with reference to FIG. 3.

Sputter Deposition of TCO

There are numerous methods to deposit the TCO layer. One method of deposition involves utilizing chemical vapor deposition (CVD). CVD is a deposition method that is performed at a very high deposition temperature such as 300 degrees Celsius and above. The high temperature enables the technician to control the texture of the TCO and thus, the light scattering. Another deposition method involves sputtering. Sputtering is beneficial because it obtains a film with low sheet resistance, obtains high transmittance and mobility, and obtains a particular haze. However, in order to obtain the same film properties and the same texturing results as CVD, the temperature of the PVD process is performed at an elevated temperature such as about 300 degrees Celsius to about 400 degrees Celsius. It is difficult to control an in-line film process with a uniform temperature, and it is difficult to have reliable hardware and tool ownership is expensive. The higher temperature enables the technician to control the texture of the TCO layer. The higher temperature is achieved by heating the substrate in addition to heating the substrate with the plasma generated during the process. In one embodiment, the substrate may comprise glass. In another embodiment, the substrate may comprise soda lime glass. Whenever the substrate contains a material that may diffuse into the other layers, it may be beneficial to deposit a dielectric diffusion barrier layer (such as a dielectric sodium diffusion barrier layer) onto the substrate.

It has surprisingly been found that acceptable film properties and texturing results can be achieved by a 'cold' PVD process followed by an annealing process and an etching process. The PVD process discussed below may be accomplished without providing any additional heating beyond the heating that results from the plasma generated in the chamber. Thus, the process is considered to be a 'cold' process because the substrate is not actively heated. In one embodiment, the process may be performed at room temperature. In another embodiment, the process temperature may be between about 23 degrees Celsius to about 30 degrees Celsius. For large area substrates, controlling the temperature of the substrate from the center to the edge can be a challenge when supplying heat to the substrate through the susceptor. For example, the temperature at the center may be different than the temperature at the edge which could lead to an unacceptable deposition on the substrate. If the film deposited is unacceptable, the entire substrate is scrapped, which can be costly. An additional problem with the 'hot' method whereby the substrate is heated with a heater in the susceptor is that the throughput is slower than the 'cold' process because the substrate is heated and then rapidly cooled. Therefore, when the plasma is the only heating for the substrate, the variable of heating through the susceptor is removed and a level of uncertainty is removed. An additional benefit of the 'cold' PVD process is that a more uniform grain structure in the deposited film results as compared to the 'hot' PVD process. Naturally, both the 'hot' and 'cold' PVD processes may be performed under vacuum. After the TCO has been deposited by 'cold' PVD, the substrate is then annealed and etched to texture the TCO. As will be discussed below depending upon the desired end product, the annealing and the etching may be performed in any order.

Some of the advantages to utilizing the 'cold' PVD approach followed by the annealing and etching is that the hardware systems are simpler, the hardware systems are more reliable, the hardware systems are more cost effective, that is more control of the TCO film uniformity across large area substrates for the room temperature PVD process, the system cost of ownership can be much lower and the deposition is possible in existing high-volume, in-line glass coating systems.

In order to deposit the TCO, a substrate may be placed into a sputter process chamber for deposition of the TCO layer onto the substrate. A process gas mixture is supplied into the sputter process chamber. The process gas mixture supplied into the sputter process chamber bombards the source material from the target and reacts with the sputtered material to form the desired TCO layer on the substrate surface. In one embodiment, the gas mixture may include reactive gas, non-reactive gas, and the like. Examples of non-reactive gas include, but are not limited to, inert gas, such as Ar, He, Xe, and Kr, or other suitable gases. Examples of reactive gas include, but not limited to, $O_2$, $N_2$, $N_2O$, $NO_2$, $H_2$, $NH_3$, $H_2O$, among others. Non-reactive gases may be supplied when the sputtering process is an RF, DC or AC sputtering process in which the sputtering target comprises the TCO material to be deposited such as ZnO. When the sputtering process is a reactive sputtering process, the sputtering target may comprise the metal for the TCO, such as zinc, which reacts with the reactive gas to deposit ZnO on the substrate.

In one embodiment, the argon (Ar) gas supplied into the sputter process chamber assists in bombarding the target to sputter materials from the target surface. The sputtered materials from the target react with the reactive gas in the sputter process chamber, thereby forming a TCO layer having desired film properties on the substrate. The TCO layer formed at a different location of the photoelectric conversion unit may have different film properties to achieve different current conversion efficiency requirements. For example, a bottom TCO layer may require film properties, such as relatively high textured surface, high transparency, and high conductivity. An upper TCO layer may require high transparency as well, however, any surface texturing is much less than that of the bottom TCO layer. The gas mixture and/or other process parameters may be varied during the sputtering deposition process, thereby creating the TCO layer with desired film properties for different film quality requirements. The texturing process will be described below.

In one particular embodiment, the process gas mixture supplied into the sputter process chamber includes at least one of Ar, $O_2$ or $H_2$. In one embodiment, the $O_2$ gas may be supplied at a flow rate between about 0 sccm and about 100 sccm, such as between about 5 sccm and about 30 sccm, for example between about 5 sccm and about 15 sccm. The Ar gas may be supplied into the processing chamber 100 at a flow rate between about 150 sccm and between 500 sccm. The $H_2$ gas may be supplied into the processing chamber 100 at a flow rate between about 0 sccm and between 100 sccm, such as between about 5 sccm and about 30 sccm. Alternatively, $O_2$ gas flow may be controlled at a flow rate per total flow rate below about 0.1 percent of the total gas flow rate. $H_2$ gas flow may be controlled at a flow rate per total flow rate below about 0.5 percent of the total gas flow rate.

In the embodiment wherein the gas mixture supplied into the process chamber includes Ar and $O_2$ gas, the Ar gas flow rate supplied in the gas mixture is controlled at between about 90 percent by volume to less than 100 percent by volume and the oxygen gas flow rate is controlled to about less than 10 percent by volume. In the embodiment wherein the gas mixture supplied into the process chamber includes Ar, $O_2$ and $H_2$ gas, the Ar gas flow rate supplied in the gas mixture is controlled at between about 80 percent by volume to less than 100 percent by volume, the oxygen gas flow rate is controlled about less than 10 percent by volume, and the hydrogen gas flow rate is also controlled to less than the flammability limit such as at about less than 5 percent by volume.

As different gas mixtures supplied into the process chamber may provide different source ions that may be reacted with the source material sputtered off the target, by supplying different gas species in the gas mixture, a control of the film properties of the TCO layer may be obtained. For example, a greater amount of oxygen gas supplied in the gas mixture may result in a TCO layer having a higher quality of oxygen elements formed in the resultant TCO layer. Accordingly, by controlling the amount of reactive gas along with different selection of targets used during sputtering, a TCO layer having tailored film properties may be obtained.

After the processing gas is introduced to the chamber, RF power is supplied to the target to sputter the source material from the target which reacts with the gas mixture. It is to be understood that while reference is made to an RF reactive sputtering process, the process of depositing the TCO may be accomplished utilizing a DC or AC reactive or non-reactive sputtering process. Additionally, it is to be understood that the RF reactive sputtering process may be accomplished by introducing reactive gases in addition to inert gases into the processing chamber.

As a high voltage power is supplied to the zinc (Zn) and aluminum (Al) alloy target, the metal zinc and aluminum source material is sputtered from the target. The bias power applied between the target and the substrate support maintains a plasma formed from the gas mixture in the process chamber. The ions mainly from the gas mixture in the plasma bombard and sputter off material from the target. The reactive gases react with the growing sputtered film to form a layer with desired composition on the substrate. In one embodiment, a metal alloy target made of zinc (Zn) and aluminum (Al) metal alloy is utilized as a source material of the target for sputter process. The ratio of Al metal included in the Zn target is controlled at about less than 3 percent by weight, such as less than 2 percent by weight, such as about less than 0.5 percent by weight, for example, about 0.25 percent by weight. In another embodiment, a metal alloy target made of zinc oxide (ZnO) and aluminum oxide ($Al_2O_3$) metal alloy is utilized as a source material of the target for sputter process. The ratio of $Al_2O_3$ included in the ZnO target is controlled at between about less than 3 percent by weight, for example about less than 2 percent by weight, such as about less than 0.5 percent by weight, for example, about 0.25 percent by weight.

In the embodiment wherein the target is made of zinc (Zn) and aluminum (Al) metals, the gas mixture supplied for sputtering may include argon and oxygen gas. The argon gas is used to bombard and sputter the target, and the oxygen ions dissociated from the $O_2$ gas mixture reacts with the zinc and aluminum ions sputtered from the target, forming a zinc oxide (ZnO) and aluminum oxide ($Al_2O_3$) containing TCO layer on the substrate. The RF, DC or AC power is applied to the target during processing. In the embodiment wherein the target is fabricated from ZnO having $Al_2O_3$ doped therein, the gas mixture used to bombard the target may include argon but may or may not include $O_2$ gas. In this embodiment, the oxygen gas may be optionally eliminated as the target provides the oxygen elements that are deposited in the TCO layer. In some embodiments, the hydrogen gas may be used in the gas mixture to assist in bombarding and reacting with the source material from the target regardless of the materials of the target.

In one embodiment, a RF power of between about 100 Watts and about 60000 Watts may be supplied to the target. Alternatively, the RF power may be controlled by RF power density supplied between about 0.15 Watts per centimeter square and about 15 Watts per centimeter square, for example, about 4 Watts per centimeter square and about 8 Watts per centimeter square. Alternatively, the DC power may be supplied between about 0.15 Watts per centimeter square and about 15 Watts per centimeter square. In one embodiment, a mid-frequency AC electrical bias may be applied to a zinc target to sputter the zinc which will react with oxygen to deposit zinc oxide on the substrate. In one embodiment, the mid-frequency AC electrical bias may be between about 2 kW/meter target length to about 17 kW/meter target length.

Several process parameters may be regulated. In one embodiment, a pressure of the gas mixture in the process chamber is regulated between about 2 mTorr and about 10 mTorr. The substrate temperature may be maintained between about 25 degrees Celsius and about 100 degrees Celsius. The processing time may be processed at a predetermined processing period or after a desired thickness of the layer is deposited on the substrate. In one embodiment, the process time may be processed at between about 30 seconds and about 400 seconds. In one embodiment, the thickness of the TCO layer is between about 5,000 Å and about 10,000 Å. In the embodiment wherein a substrate with different dimension is desired to be processed, process temperature, pressure and spacing configured in a process chamber with different dimension do not change in accordance with a change in substrate and/or chamber size.

During the deposition process, as the ions dissociated from the gas mixture react with sputtered off material from the target, a TCO layer with desired composition is therefore formed on the substrate surface. In one embodiment, the TCO layer as deposited is a ZnO layer having a desired amount of aluminum oxide dopant formed therein. It is believed that the TCO layer having a desired amount of $Al_2O_3$ dopant formed in the ZnO layer can efficiently improve current conversion efficiency of the photoelectric conversion unit. The aluminum elements formed in the TCO layer may provide higher film conductivity, thereby assisting carrying greater amount of current in the TCO layer. Additionally, it is believed that higher amount of oxygen elements formed in the TCO layer increases film transmittance that allows greater amount of current generated in the photoelectric conversion unit. Furthermore, a high film transparency is desired to maximize the light transmitting efficiency. Accordingly, by controlling a desired amount of aluminum oxide formed in the zinc containing layer, the TCO layer having desired film properties, such as high transmittance and high current conversion efficiency, may be obtained.

In one embodiment, the oxygen source formed in the TCO layer may be provided from the gas mixture supplied into the process chamber during sputter process. Alternatively, the oxygen source may be provided from a selected target having metal oxide alloy prefabricated in the target so that when sputtering, both metallic and oxygen ions may be sputtered off the target and deposited on the substrate surface. In the embodiment wherein the selected target is fabricated from a zinc and aluminum metal alloy, a gas mixture including argon, oxygen may be used to provide oxygen ions, when dissociated, to react with the zinc and aluminum ions sputtered from the target, forming zinc oxide layer having desired concentration of aluminum oxide on the substrate. In the embodiment wherein the selected target is fabricated from zinc oxide and aluminum oxide, a gas mixture including argon gas may be used. The oxygen gas may be optionally supplied in the gas mixture. The hydrogen gas may be optionally supplied in both cases.

As discussed above, a TCO layer having a desired amount of $Al_2O_3$ dopant formed in the ZnO layer may improve the film conductivity and film transparency. The $Al_2O_3$ dopant source may be provided from the target during processing. In one embodiment, the ratio of $Al_2O_3$ included in the ZnO target is controlled at between about less than 3 percent, for example about less than 2 percent by weight, such as about less than 0.5 percent by weight, for example, about 0.25 percent by weight. In one embodiment, the lower the dopant concentration of $Al_2O_3$ formed in the ZnO target, a relatively higher amount of oxygen gas may be supplied in the gas mixture during sputtering to maintain a desired transmittance formed in the TCO layer. For example, if the ratio of $Al_2O_3$ doped in the ZnO target is about 0.5 percent by weight, the gas mixture may have an oxygen gas flow rate about 5 percent by volume and argon gas flow rate about 95 percent by volume. However, if the ratio of $Al_2O_3$ doped in the ZnO target is as low as about 0.25 percent by weight, the gas mixture may have a higher oxygen gas flow rate about 7-8 percent by volume and lower argon gas flow rate about 92-93 percent by volume. Since both oxygen elements and $Al_2O_3$ elements formed in the TCO layer are believed to increase film transmittance, when a lower dopant concentration of $Al_2O_3$ target is used, a higher oxygen gas in the gas mixture may be used to compensate the lower dopant concentration of $Al_2O_3$ formed in the target. In some embodiments, hydrogen gas or water vapor may also be utilized to increase the resultant film transmittance or enhance other film properties. In one embodiment, the TCO layer has an $Al_2O_3$ dopant concentration between about 0.25 percent and about 3 percent in a ZnO based layer.

In operation, the incident light provided by the environment is supplied to the PV solar cell. The photoelectric conversion unit in the PV solar cell absorbs the light energy and converts the light energy into electrical energy by operation of the p-i-n junctions formed in the photoelectric conversion unit, thereby generating electricity or energy. Alternatively, the PV solar cell may be fabricated or deposited in a reversed order. For example, the substrate may be disposed over the back reflector.

While the TCO has been described as being ZnO, it is to be understood that other materials may be used as the TCO such as SnO. Additionally, a dopant need not be present. However, if a dopant is present, the dopant need not be aluminum, but rather, may be any of a number of other dopants such as titanium, tantalum, gallium, cadmium, boron, indium, fluorine, and tin.

Once the TCO has been deposited, the post deposition treatment of the TCO occurs in order to improve film properties and obtain the desired texture of the TCO. The post deposition treatment involves annealing the substrate and etching the TCO. Depending upon the desired final product, the annealing and the etching may be reversed such that the etching occurs before the annealing. Additionally, after the texture of the TCO has been measured, additional annealing and/or etching may occur if necessary. In one embodiment, the annealing and the sputtering may occur in the same chamber. Performing the annealing and sputtering in the same chamber may be beneficial if the annealing is performed after the sputtering and before the texturing. In another embodiment, the annealing may occur in a separate chamber from the sputtering. If the texturing is performed before the annealing, it may be beneficial to have a separate annealing chamber.

Vacuum Annealing

In one embodiment for the annealing, the substrate (and hence the TCO deposited thereover) is heated to an annealing temperature for a predetermined period of time. In one embodiment, the annealing temperature may be between about 250 degrees Celsius to about 600 degrees Celsius. In one embodiment, the annealing may occur for about 15 minutes to about 60 minutes. In another embodiment, the annealing may occur for 5 minutes or more at ambient pressure. The annealing relaxes out the defects in the TCO and thus improves the conductivity and transmission of the TCO. Additionally, the annealing may densify the deposited TCO and causes the grains to arrange into a more uniform structure. The annealing may occur in numerous environments. In one preferred embodiment, the annealing occurs in an environment of $N_2$ and $H_2$ forming gas. In another preferred embodiment, the annealing occurs in an environment of Ar and $H_2$. In another preferred embodiment, the annealing occurs in an environment of $N_2$. In another preferred embodiment, the annealing occurs in an environment of Ar. It is contemplated that other gases may be used as well such as ammonia, $N_2O$, NO, $NO_2$, hydrazine, $O_2$, CO, $CO_2$, water vapor or combinations thereof. The annealing may increase the transmittance of the TCO to greater than 80 percent and decrease the R5 to about 10 ohm/sq or lower.

The annealing process may have several steps. One embodiment of an annealing process is described here. The first step involves evacuating the processing chamber. During the evacuation, the substrate is not heated and no gas is provided to the processing chamber. The evacuating may take about 10-20 minutes and lower the pressure in the chamber from about atmospheric pressure to about 35 to about 50 mTorr.

Thereafter, the initial heat-up proceeds. To perform the initial heat-up, the susceptor heater is turned on and the gas is introduced at a flow rate of about 50 sccm to reduce the pressure to about 2 to about 3 mTorr. During the initial heat up, diffusion pumps may be used to maintain the pressure. The initial heat-up may take from about 30 minutes to about 90 minutes.

Then, the annealing begins. The annealing takes about 15 minutes to about 60 minutes. During the annealing, the gas is provided at a flow rate of about 90 sccm and the chamber is evacuated to maintain a pressure of about 150 mTorr.

After the annealing, the substrate is cooled down in a two stage cool down process. The susceptor heater is turned off and will remain off for the remainder of the annealing process. In the first stage, which may take between about 30 minutes to about 60 minutes, the gas is continued to be provided at about 50 sccm and the pressure is maintained at about 2 mTorr to about 3 mTorr. In the second stage, which may take about 60 minutes to about 120 minutes, no gas is provided and the chamber pressure is further reduced to about 0.001 mTorr to about 0.005 mTorr. Thereafter, the chamber is vented to atmosphere which takes about 2 minutes. The annealing process described here is a vacuum process. Experiments have indicated that atmospheric pressure processes may be effective provided that the gas environment is properly controlled. Furthermore, it is assumed that the throughput of the annealing process can be significantly improved by enhancements to the vacuum annealing hardware, or with an atmospheric pressure annealing process.

Atmospheric Annealing

In one embodiment, the annealing may occur at essentially atmospheric pressure. Previously, to make the ZnO with $Al_2O_3$ doping, a technician needed to heat-up the PVD chamber up to 300-400 degrees Celsius to achieve the predetermined film characteristics, such as low sheet resistance, high transmittance mobility, and predetermined haze. With this approach, there were a lot of disadvantages due to high process costs, difficulty to control in-line film formation with a uniform temperature, difficulty to have reliable hardware, and the high cost of tool ownership.

It has surprisingly been found that a tempering chamber may be utilized to perform the annealing. The annealing may occur as a two stage annealing process. In the first stage, the substrate with the TCO deposited thereon is heated in an environment that is substantially at atmospheric pressure. Then, in the second stage, the TCO layer is thermally quenched with a high flow of a gas or gas mixture that is free of oxygen. During the thermal quenching, the temperature of the substrate is lowered. After the thermal quenching, the substrate may then be exposed to atmosphere.

The advantage of utilizing a cold TCO deposition, followed by texture etch, thermal anneal and thermal quench, as compared to high temperature deposition, is that the hardware system utilized is simpler, more reliable, and cost effective. Additionally, there is more control of the TCO film uniformity across large area substrates for room temperature PVD. The system cost of ownership can be much lower than that for high temperature processes. The process permits deposition on existing high-volume, in-line substrate coating systems.

The thermal treatment or annealing may occur at a temperature of at least 200 degrees Celsius. In one embodiment, the annealing may occur at a temperature of about 400 degrees Celsius. In another embodiment, the annealing may occur at a temperature of between about 300 degrees Celsius and about 500 degrees Celsius.

The annealing process consists of heat-up, annealing step at the desired temperature, and cool down (e.g., thermal quenching). During all steps it is preferable to have an $O_2$-free environment to suppress oxidation of the TCO film and maintain desirable electrical and optical properties. Examples of suitable gas compositions that may be used include $N_2/H_2$, $Ar/H_2$, and $N_2$. For the $N_2/H_2$ mixture, the nitrogen may be present in an amount of about 96 percent by volume while the hydrogen may be present in an amount of about 4 percent by volume. For the argon/hydrogen mixture, the argon may be present in an amount of about 97 percent by volume while the hydrogen may be present in an amount of about 3 percent by volume. The annealing may occur at near-atmospheric pressures. Because the annealing may occur at near-atmospheric pressures, a tempering furnace similar to those used in the production of commercial tempered glass may be used for the annealing process. Typically on commercial tempered glass tempering furnaces, a high convective flow of air is used to quench the heated glass. For TCO annealing applications, a high flow of preferably $O_2$-free gas is be used, and would enable higher throughput because of the rapid cooling. While the target pressure is atmospheric pressure for the annealing, due to the high gas flow rate of the $O_2$-free gas or gas mixture the actual pressure may be nominally above atmospheric pressure. It is to be understood that while an $O_2$-free environment is preferred, oxygen may be present in small quantities. For example, the atmosphere in which the anneal may occur may have a partial pressure of oxygen that is below the partial pressure of oxygen present in air. Additionally or alternatively, a sacrificial protective layer may be deposited over the TCO prior to annealing to permit the TCO to be annealed in an environment that could include air.

The annealing and thermal quenching may proceed as follows. The substrate may be placed into the annealing chamber. It is to be understood that the "annealing chamber" may refer to simply a tempering chamber that is separated from the vacuum sputtering chamber, the sputtering chamber itself when it is used to perform both deposition and annealing, and a chamber of an in-line system. After the substrate is in the annealing chamber, the temperature of the substrate (and correspondingly the TCO) is raised to a temperature within the ranges discussed above. During the annealing, the TCO is exposed to a substantially oxygen free environment at a pressure that may be nominally above atmospheric pressure. The oxygen free environment prevents any further oxidation of the TCO layer. Alternatively, a reduced oxygen partial pressure atmosphere may be utilized or a protective layer may be formed over the TCO prior to annealing or a thicker TCO layer may be used with appropriate properties to protect the film thereunder. The annealing may occur for a time period of up to 60 minutes. Following the annealing, the thermal quenching begins. The substrate may simply remain within the same chamber, be moved to another section of the chamber, or moved to a completely separate chamber. In any event, the TCO is not exposed to air or oxygen between the annealing and thermal quenching processes. Oxygen free gas or gas mixtures are delivered to the thermal quenching location. The pressure during the thermal quenching may be nominally above atmospheric pressure due to the flow of the gas. During the thermal quenching, the temperature of the substrate is reduced to below 200 degrees Celsius. In one embodiment, the temperature of the substrate is reduced to about 100 degrees Celsius. Following the thermal quenching, the TCO may be exposed to an oxygen containing environment such as air.

As mentioned above, the order of the texture etching and the annealing may be switched based upon optimization with respect to film properties, solar cell performance, and system throughput. For the sequence in which annealing is performed after etching, annealing is performed on a stand-alone separate tool. This tool would be either a vacuum annealing system or more preferably an atmospheric pressure system for the potential of lower cost and higher throughput. If the annealing is performed first, this can be performed in line by addition of additional compartments onto the PVD coater, or in a separate tool.

Etching

The etching may occur to texture the TCO. In one embodiment, the etching may comprise a wet etching process. The etching may occur for a time period of between about 10 seconds to about 60 seconds. In one embodiment, the etching solution may comprise HCl, $H_2O_2$ and de-ionized water in a concentration ratio of HCl and $H_2O_2$ total solution between about 0.25 percent to about 10 percent. In another embodiment, the etching solution may comprise HCl and de-ionized water where the HCl is present in a concentration of about 0.25 percent to about 10 percent of the total solution. In another embodiment, the etching solution may comprise $HNO_3$ and de-ionized water with a concentration ratio of $HNO_3$ to total solution of between about 0.25 percent and about 10 percent. In another embodiment, the etching solution may comprise $H_2SO_4$ and de-ionized water with the $H_2SO_4$ having a concentration ratio of between about 0.25 percent to about 10 percent of the total solution. For the etching, a nearly completely diffuse transmission or reflection of light without optical loss on the interface is the goal of the texture etch. The texturing is beneficial for light trapping by amorphous silicon/microcrystalline silicon absorption for long wavelengths because silicon absorption is limited by indirect band gap nature. The etching is beneficial in improving the haze of the TCO. In one embodiment, an aluminum doped ZnO having 1% aluminum may have a haze of about 1.36 prior to etching, a transmittance of 82 percent, a sheet resistance of between about 5.8Ω/□ to about 7.6Ω/□, a resistivity of about $5.9 \times 10^{-4}$ Ω-cm, a mobility of 26.2 cm²/V-s and a concentration of $4.08 \times 10^{20}$ cm$^{-3}$.

The etching chemistry may be chosen based upon the desired texturing to be obtained. For example, the different etching chemistries will affect the shape of the texture. A pyramid or pointy roughness may not be beneficial because of how the light reflects and refracts through the TCO. A rounded shaped on the surface may be better than a pointy shape. The material of the TCO will also affect the etching rate and how the etching occurs. Thus, the etching chemistry for a ZnO TCO may be different than the etching chemistry for a SnO TCO.

Etch Quenching

After the TCO layer is etched to texture the top surface, the solar cell structure may then be quenched by exposing the TCO layer to a solution having a pH sufficient to neutralize the etching solution that may remain on the TCO layer. The quenching may occur for a sufficient time to prevent further etching by the etching solution, but for only so long as to not being etching the TCO layer with the quenching solution. After the quenching is completed, the solar cell structure may be rinsed in de-ionized water to remove any remaining etching solution or quenching solution.

When a TCO layer is deposited, the TCO layer may be textured to improve the functionality of the solar cell. The etching textures the TCO. The etching may occur for a time period of between about 20 seconds to about 120 seconds. The etching chemistry may be chosen based upon the desired texturing to be obtained. Thus, the etching chemistry for a ZnO TCO may be different than the etching chemistry for a SnO TCO. For example, SnO that has been pyrolytically CVD deposited may not be wet etched because the SnO is textured as it is deposited based upon the deposition conditions. One manner of etching the ZnO TCO layer involves exposing the deposited ZnO TCO layer to an etchant such as HCl. In one embodiment, the HCl may be diluted in de-ionized water so that it is about 0.2 percent to about 5 percent by volume. Other etchants may be used as well. For example, $HNO_3$, $H_2SO_4$, $H_3PO_4$ and combinations thereof are other acids that may be used to etch the ZnO TCO layer.

Figure 5:
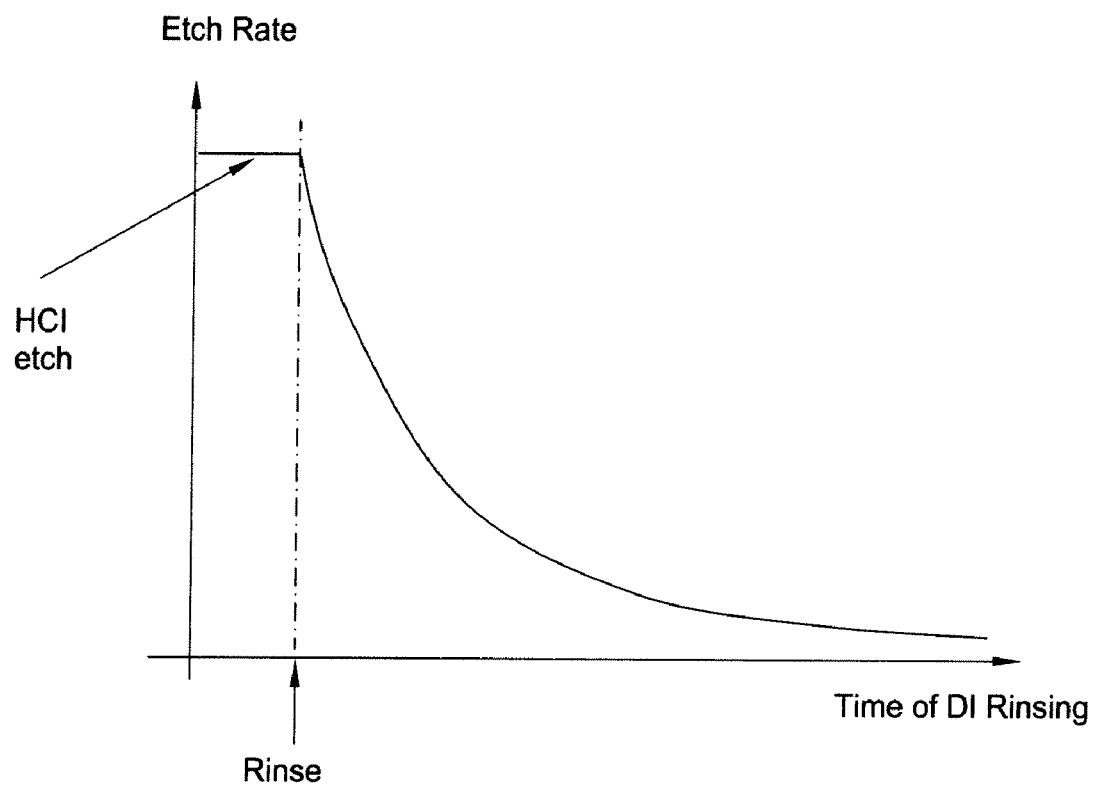
FIG. 5 is a graph showing the etch rate versus time.

The primary mechanism of TCO texturing is believed to be etching around grain boundaries resulting in surface texturing. The object of texturing the TCO layer is to achieve good uniformity of texture and a high haze surface texture. One of the problems with wet etching is the transition from the wet etching solution to the de-ionized water rinse. The acid continues to etch the TCO while the substrate is transferred to the de-ionized water rinsing station from the etch station because etchant remains on the TCO layer. If the pH is low, such as less than 3, the etching continues to occur at the surface boundary. As a result, the uniformity and the texture morphology are affected. FIG. 5 is a graph showing the etch rate versus time where the etchant continues to etch the TCO as the TCO is moved to the rinse station. By quenching the TCO with a higher pH solution before rinsing the TCO, the acid etching may stop. The higher pH solution may be used to counteract and neutralize the etchant remaining on the TCO. The quenching may be performed with diluted ammonia hydroxide (0.10 to 6 percent) solution to planarize the textured surface. By planarizing the textured surface, it is understood to mean uniformly textured. As used in this specification, planarizing does not mean forming a substantially flat surface.

The goal for the final product of the TCO layer is to have a high haze and a low resistivity. When the TCO is etched, the TCO is textured and thus, the top surface of the TCO may not be perfectly planar which may increase the resistivity. However, the etching increases the haze by texturing the surface to achieve better light trapping and improve solar cell efficiency. A happy balance should be struck between the resistivity and the haze.

As discussed above, once the TCO has been textured, the substrate is transferred to a de-ionized water rinse to remove any remaining etchant. In order to reduce any additional etching of the TCO once the substrate has been removed from the etching location (spray or dip bath for example) the TCO may be quenched to counteract the effects of the etchant. The quench may be a high pH solution that is used to improve the TCO texturing process. In one embodiment, the process may proceed as follows. The TCO, for example ZnO, may be etched with an etchant, then quenched with a base solution and then rinsed in de-ionized water. For the etching, the etching may comprise exposing the TCO to an etchant such as HCl, a solution having a pH of between about 1 and about 1.3, or a solution having an acid (such as HCl, $HNO_3$, $H_3PO_4$, $H_2SO_4$ and combinations thereof) diluted to between about 0.2 percent to about 0.5 percent by volume. For the quenching, the basic solution may comprise ammonium hydroxide, a basic solution (such as a solution containing ammonium hydroxide or KOH) diluted to between about 0.1 percent to about 10 percent by volume, or a solution having a pH of between 10 and 11.

The etching results in anisotropic etching of the TCO layer at the grain boundaries. The basic solution counteracts or neutralizes the acid etchant to stop etching of the TCO layer. Other basic solutions may be utilized as an alternative to or in addition to the ammonium hydroxide. For example, KOH may be used as a basic solution. In general, the basic solution should have a pH of 10 or more.

Figure 6:
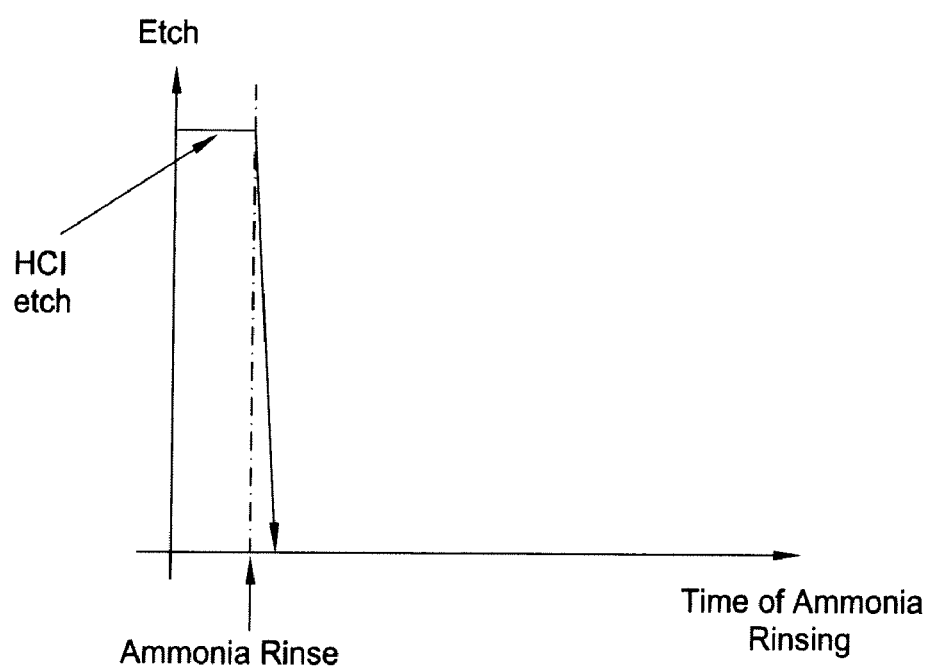
FIG. 6 is a graph showing the etch rate versus time.

FIG. 6 is a graph showing the etch rate versus time. In the embodiment shown in FIG. 6, the TCO has been etched in HCl and then quenched in ammonia hydroxide. In comparing FIG. 6 to FIG. 5, it is clear that the quenching significantly reduced the amount of etching that occurred after the etching step was complete and before the rinsing started.

One of the unexpected benefits of quenching is that the haze of the TCO layer is improved. Additionally, the basic solution, such as ammonium hydroxide, cleans the surface of the TCO to remove any zinc particles that have not reacted with oxygen. The quenching may occur by spraying the basic solution onto the TCO, dipping the TCO into the basic solution, or other effective delivery methods for the quenching solution.

It is important that the quenching does not begin to etch the TCO layer before the rinsing. If the basic solution begins to etch the TCO, then the peaks of the texturized TCO layer may be dulled which may actually reduce haze and solar cell efficiency. It has been determined that the quenching should occur for a period of between about 10 seconds and about 30 seconds. If the quenching occurs for less than about 10 seconds, the quenching has a negligible effect and the TCO is etched by the etchant. If the quenching occurs for more then about 30 seconds, then the basic solution may begin to etch the TCO. The pH of the quenching solution should be 10 or above. For pH values below 10, the basic solution may not be sufficiently strong to quickly stop the etching. Thus, it has been found that the most effective conditions are a pH of greater than 10 and quenching for between 10 seconds and 30 seconds. The quenching may occur by dipping the TCO into the solution or by spraying the solution onto the TCO or by other well known methods of exposing a TCO to a solution.

A TCO that is simply etched without quenching (for example, 30 second etch in 0.2 volume percent HCl with de-ionized water dip) may have a haze of about 24 percent while a TCO that is etched with the same etching conditions but then quenched (for example ammonium hydroxide), the haze is increased to about 28 percent. The mobility may also increase with the use of a quenching step. Thus, the haze may increase by more than 10 percent and the mobility of the TCO may increase about 2 percent.

There are several advantages to utilizing the quenching process after the etching process. A post HCl wet etch quench with ammonia hydroxide may provide a fast etch stop and improve the texture uniformity. A post HCl etch surface treatment with ammonia hydroxide is used to remove post HCl ZnO particles and residues. Ammonia hydroxide etch quench may be used to increase the haze with a minimal sheet resistance increase. An extended ammonia hydroxide treatment after the HCl etch may be used to modify the texture morphology and provide texture planarization to improve ZnO TCO and amorphous silicon film interface.

As mentioned above, the annealing and etching may occur in any order, depending upon the desired ultimate use of the TCO. For example, when the TCO will eventually be a part of a tandem junction solar cell, the etching may occur before the annealing. By performing the etching before the annealing, the texture roughness of the TCO may be generally higher than when the annealing occurs first. Because of the greater texture or surface roughness, the haze may be greater than about 25. A higher haze is beneficial of obtaining higher solar cell efficiency in a tandem junction solar cell.

When the TCO is to be used in a single junction solar cell, it may be beneficial to perform the annealing before the etching. The annealing could be performed within a hybrid heater system without exposing the TCO to air in between PVD and annealing. Additionally, the haze for the single junction solar cell may be about 13 or greater. By performing the annealing before the etching, the throughput of the system may be higher because the evacuation step may be eliminated that would otherwise be present between an etching and annealing process. It is to be understood that while wet etching has been specifically described, it is contemplated that a dry etching process may be performed instead. Additionally, the PVD, annealing and etching may be performed in a single cluster tool having all three processing chambers attached to a common transfer chamber. Alternatively, a single chamber may be utilized to perform both the PVD and annealing and a separate etching chamber may be used for texturing. Alternatively, the PVD, annealing and etching may be performed in an in-line system.

By performing a 'cold' PVD process, annealing and etching, a TCO film may be formed on a substrate that has the desired haze and efficiency to meet the needs of solar cell manufacturing. The TCO formed from the methods described herein may also be beneficial for use in electrochromic technologies.

While the foregoing is directed to embodiments of the present invention, other and further embodiments of the invention may be devised without departing from the basic scope thereof, and the scope thereof is determined by the claims that follow.

The invention claimed is:

1. A method, comprising:
    forming a transparent conductive oxide layer over a substrate;
    annealing the formed transparent conductive oxide layer;
    etching the annealed transparent conductive oxide layer to form a roughened surface, the etching comprising exposing the annealed transparent conductive oxide layer to a wet etchant composition selected from the group consisting of:
        a mixture of HCl, $H_2O_2$ and de-ionized water having a concentration ratio of HCl and $H_2O_2$ relative to the de-ionized water of about 0.25 percent to about 10 percent;
        a mixture of HCl and de-ionized water having a concentration ratio of HCl relative to the de-ionized water of about 0.25 percent to about 10 percent;
        a mixture of $HNO_3$ and de-ionized water having a concentration ratio of $HNO_3$ relative to the de-ionized water of about 0.25 percent to about 10 percent; and
        a mixture of $H_2SO_4$ and de-ionized water having a concentration ratio of $H_2SO_4$ relative to the de-ionized water of about 0.25 percent to about 10 percent; and
    quenching the etched transparent conductive oxide layer by exposing the transparent conductive oxide layer to a basic solution having a pH of greater than about 10.

2. The method of claim 1, wherein forming the transparent conductive oxide layer comprises sputter depositing the transparent conductive oxide layer.

3. The method of claim 1, further comprising:
    depositing a p-doped semiconductor layer over the etched transparent conductive oxide layer;
    depositing an intrinsic semiconductor layer over the p-doped semiconductor layer; and
    depositing an n-doped semiconductor layer over the intrinsic semiconductor layer.

4. A method, comprising:
    forming a transparent conductive oxide layer over a substrate;
    annealing the formed transparent conductive oxide layer;
    etching the annealed transparent conductive oxide layer to form a roughened surface, the etching comprising exposing the annealed transparent conductive oxide layer to a wet etchant composition selected from the group consisting of:
        a mixture of HCl, $H_2O_2$ and de-ionized water having a concentration ratio of HCl and $H_2O_2$ relative to the de-ionized water of about 0.25 percent to about 10 percent;
        a mixture of HCl and de-ionized water having a concentration ratio of HCl relative to the de-ionized water of about 0.25 percent to about 10 percent;
        a mixture of $HNO_3$ and de-ionized water having a concentration ratio of $HNO_3$ relative to the de-ionized water of about 0.25 percent to about 10 percent; and
        a mixture of $H_2SO_4$ and de-ionized water having a concentration ratio of $H_2SO_4$ relative to the de-ionized water of about 0.25 percent to about 10 percent;
    quenching the etched transparent conductive oxide layer by exposing the transparent conductive oxide layer to a basic solution having a pH of greater than about 10; and
    rinsing the quenched transparent conductive oxide layer with de-ionized water.

5. The method of claim 4, wherein the quenching comprises spraying the basic solution onto the transparent conductive oxide layer or dipping the transparent conductive oxide layer into the basic solution.

6. The method of claim 5, wherein the basic solution comprises ammonium hydroxide.

7. The method of claim 5, wherein the basic solution comprises potassium hydroxide.

8. The method of claim 5, wherein forming the transparent conductive oxide layer comprises sputter depositing the transparent conductive oxide layer.

9. The method of claim 1, wherein the annealing comprises:
    thermal treating the transparent conductive oxide layer at a first temperature; and
    thermal quenching the thermally treated transparent conductive oxide layer at a second temperature lower than the first temperature.

10. A method, comprising:
    forming a transparent conductive oxide layer over a substrate;
    annealing the formed transparent conductive oxide layer;
    thermal treating the transparent conductive oxide layer at a first temperature;

thermal quenching the thermally treated transparent conductive oxide layer at a second temperature lower than the first temperature, wherein the thermal quenching comprises reducing the temperature of the thermally treated transparent conductive oxide layer from the first temperature to the second temperature in a substantially oxygen free atmosphere; and etching the annealed transparent conductive oxide layer to form a roughened surface, the etching comprising exposing the annealed transparent conductive oxide layer to a wet etchant composition selected from the group consisting of:

a mixture of HCl, $H_2O_2$ and de-ionized water having a concentration ratio of HCl and $H_2O_2$ relative to the de-ionized water of about 0.25 percent to about 10 percent;

a mixture of HCl and de-ionized water having a concentration ratio of HCl relative to the de-ionized water of about 0.25 percent to about 10 percent;

a mixture of $HNO_3$ and de-ionized water having a concentration ratio of $HNO_3$ relative to the de-ionized water of about 0.25 percent to about 10 percent; and a mixture of $H_2SO_4$ and de-ionized water having a concentration ratio of $H_2SO_4$ relative to the de-ionized water of about 0.25 percent to about 10 percent.

11. The method of claim 10, wherein the thermal quenching further comprises exposing the thermally treated transparent conductive oxide layer to a gas selected from the group consisting of:

$N_2/H_2$ mixture;
$Ar/H_2$ mixture; or
$N_2$.

12. The method of claim 11, wherein forming the transparent conductive oxide layer comprises sputter depositing the transparent conductive oxide layer.

13. A method, comprising:

forming a transparent conductive oxide layer over a substrate;

annealing the formed transparent conductive oxide layer;

thermal treating the transparent conductive oxide layer at a first temperature;

thermal quenching the thermally treated transparent conductive oxide layer at a second temperature lower than the first temperature, wherein the transparent conductive oxide layer is maintained in a substantially oxygen free environment during the thermal treating, the thermal quenching, and during any time between the thermal treating and thermal quenching; and etching the annealed transparent conductive oxide layer to form a roughened surface, the etching comprising exposing the annealed transparent conductive oxide layer to a wet etchant composition selected from the group consisting of:

a mixture of HCl, $H_2O_2$ and de-ionized water having a concentration ratio of HCl and $H_2O_2$ relative to the de-ionized water of about 0.25 percent to about 10 percent;

a mixture of HCl and de-ionized water having a concentration ratio of HCl relative to the de-ionized water of about 0.25 percent to about 10 percent;

a mixture of $HNO_3$ and de-ionized water having a concentration ratio of $HNO_3$ relative to the de-ionized water of about 0.25 percent to about 10 percent; and a mixture of $H_2SO_4$ and de-ionized water having a concentration ratio of $H_2SO_4$ relative to the de-ionized water of about 0.25 percent to about 10 percent.

14. The method of claim 13, wherein forming the transparent conductive oxide layer comprises sputter depositing the transparent conductive oxide layer.

15. The method of claim 9, wherein the thermal quenching comprises reducing the temperature of the thermally treated transparent conductive oxide layer from the first temperature to the second temperature in an environment having a partial pressure of oxygen that is below the partial pressure of oxygen present in air.

16. A method, comprising:

forming a transparent conductive oxide layer over a substrate;

annealing the formed transparent conductive oxide layer;

thermal treating the transparent conductive oxide layer at a first temperature;

thermal quenching the thermally treated transparent conductive oxide layer at a second temperature lower than the first temperature, wherein the transparent conductive oxide layer is maintained in an environment having a partial pressure of oxygen that is below the partial pressure of oxygen present in air during the thermal treating, the thermal quenching, and during any time between the thermal treating and thermal quenching; and etching the annealed transparent conductive oxide layer to form a roughened surface, the etching comprising exposing the annealed transparent conductive oxide layer to a wet etchant composition selected from the group consisting of:

a mixture of HCl, $H_2O_2$ and de-ionized water having a concentration ratio of HCl and $H_2O_2$ relative to the de-ionized water of about 0.25 percent to about 10 percent;

a mixture of HCl and de-ionized water having a concentration ratio of HCl relative to the de-ionized water of about 0.25 percent to about 10 percent;

a mixture of $HNO_3$ and de-ionized water having a concentration ratio of $HNO_3$ relative to the de-ionized water of about 0.25 percent to about 10 percent; and a mixture of $H_2SO_4$ and de-ionized water having a concentration ratio of $H_2SO_4$ relative to the de-ionized water of about 0.25 percent to about 10 percent.

17. The method of claim 1, further comprising depositing a sacrificial protective layer over the transparent conductive oxide layer prior to annealing.

18. A method, comprising:

sputter depositing a transparent conductive oxide layer over a substrate;

annealing the sputter deposited transparent conductive oxide layer at a first temperature;

thermal quenching the annealed transparent conductive oxide layer at a second temperature lower than the first temperature in a substantially oxygen free environment;

etching the thermally quenched transparent conductive oxide layer to form a roughened surface, the etching comprising exposing the thermally quenched transparent conductive oxide layer to a wet etchant composition selected from the group consisting of:

a mixture of HCl, $H_2O_2$ and de-ionized water having a concentration ratio of HCl and $H_2O_2$ relative to the de-ionized water of about 0.25 percent to about 10 percent; and a mixture of HCl and de-ionized water having a concentration ratio of HCl relative to the de-ionized water of about 0.25 percent to about 10 percent;

quenching the etched transparent conductive oxide layer by exposing the transparent conductive oxide layer to a basic solution having a pH of greater than about 10; and rinsing the quenched transparent conductive oxide layer with de-ionized water.

19. The method of claim 18, wherein the quenching comprises spraying the basic solution onto the transparent conductive oxide layer or dipping the transparent conductive oxide layer into the basic solution.

20. The method of claim 19, wherein the basic solution comprises ammonium hydroxide.

* * * * *